US010217922B2

(12) United States Patent
Petkie

(10) Patent No.: US 10,217,922 B2
(45) Date of Patent: *Feb. 26, 2019

(54) METHODS FOR THICK FILM THERMOELECTRIC DEVICE FABRICATION

(71) Applicant: Berken Energy LLC, Loveland, CO (US)

(72) Inventor: Ronald R. Petkie, Fort Collins, CO (US)

(73) Assignee: BERKEN ENERGY LLC, Loveland, CO (US)

(*) Notice: Subject to any disclaimer, the term of this patent is extended or adjusted under 35 U.S.C. 154(b) by 102 days.

This patent is subject to a terminal disclaimer.

(21) Appl. No.: 15/167,562

(22) Filed: May 27, 2016

(65) Prior Publication Data
US 2016/0276567 A1    Sep. 22, 2016

Related U.S. Application Data

(63) Continuation of application No. 14/599,227, filed on Jan. 16, 2015, now Pat. No. 9,353,445, which is a (Continued)

(51) Int. Cl.
H01L 21/00 (2006.01)
H01L 35/32 (2006.01)
(Continued)

(52) U.S. Cl.
CPC ............ H01L 35/32 (2013.01); C23C 24/082 (2013.01); C23C 28/00 (2013.01); C23C 30/00 (2013.01);
(Continued)

(58) Field of Classification Search
CPC ....... C23C 24/082; C23C 28/00; C23C 30/00; C23C 24/08; C23C 24/085; C23C 24/087;
(Continued)

(56) References Cited

U.S. PATENT DOCUMENTS 5,306,646 A   4/1994 Lauf
6,127,619 A   10/2000 Xi et al.
(Continued)

FOREIGN PATENT DOCUMENTS

WO   2008127017 A1   10/2008

OTHER PUBLICATIONS

Extended European Search Report for EP Application No. 14190184.3, dated Jul. 16, 2015.
(Continued)

Primary Examiner — Kevin M Picardat
(74) Attorney, Agent, or Firm — FisherBroyles, LLP; Cara L. Crowley-Weber

(57) ABSTRACT

Solid state thermoelectric energy conversion devices can provide electrical energy from heat flow, creating energy, or inversely, provide cooling through applying energy. Thick film methods are applied to fabricate thermoelectric device structures using microstructures formed through deposition and subsequent thermal processing conditions. An advantageous coincidence of material properties makes possible a wide variety of unique microstructures that are easily applied for the fabrication of device structures in general. As an example, a direct bond process is applied to fabricate thermoelectric semiconductor thick films on substrates by printing and subsequent thermal processing to form unique microstructures which can be densified. Bismuth and antimony telluride are directly bonded to flexible nickel substrates.

29 Claims, 5 Drawing Sheets

Related U.S. Application Data continuation of application No. 14/170,544, filed on Jan. 31, 2014, now Pat. No. 8,956,905.

(60) Provisional application No. 61/759,983, filed on Feb. 1, 2013.

(51) Int. Cl.
| | |
|---|---|
| *H01L 35/34* | (2006.01) |
| *H01L 35/16* | (2006.01) |
| *H01L 35/18* | (2006.01) |
| *C23C 28/00* | (2006.01) |
| *C23C 30/00* | (2006.01) |
| *C23C 24/08* | (2006.01) |

(52) U.S. Cl.
CPC ............ *H01L 35/16* (2013.01); *H01L 35/18* (2013.01); *H01L 35/34* (2013.01)

(58) Field of Classification Search
CPC ..... C23C 24/10; C23C 24/103; C23C 24/106; H01L 35/16; H01L 35/18; H01L 35/32; H01L 35/34
USPC .............................. 438/54, 55, 500, 502, 610
See application file for complete search history.

(56) References Cited

U.S. PATENT DOCUMENTS

| | | | |
|---|---|---|---|
| 7,511,298 | B2 | 3/2009 | Kawaraya et al. |
| 7,700,464 | B2 | 4/2010 | Robinson et al. |
| 8,372,734 | B2 | 2/2013 | Van Duren et al. |
| 8,410,000 | B2 | 4/2013 | Machii et al. |
| 8,956,905 | B2 | 2/2015 | Petkie |
| 9,353,445 | B2 * | 5/2016 | Petkie .................... H01L 35/34 |
| 2007/0044828 | A1 * | 3/2007 | Iwanade ................. H01L 35/32 |
| | | | 136/230 |
| 2011/0303898 | A1 | 12/2011 | Tian et al. |
| 2012/0148764 | A1 | 6/2012 | Navone et al. |
| 2013/0146116 | A1 * | 6/2013 | Jovovic .................... H01B 1/16 |
| | | | 136/200 |
| 2014/0209140 | A1 * | 7/2014 | Funahashi ............... H01L 35/32 |
| | | | 136/205 |

OTHER PUBLICATIONS

Navone et al. (2010) "Development of (Bi,Sb)2(Te,Se)3-Based Thermoelectric Modules by a Screen-Printing Process," J Electronic Materials, 39(9):1755-1759.

Navone et al. (2011) "Optimization and Fabrication of a Thick Printed Thermoelectric Device," J. Electronic Materials, 40(5):789-793.

* cited by examiner

METHODS FOR THICK FILM THERMOELECTRIC DEVICE FABRICATION

CROSS-REFERENCE TO RELATED APPLICATIONS

This application is a continuation of U.S. application Ser. No. 14/599,227, which is a continuation of U.S. application Ser. No. 14/170,544, now U.S. Pat. No. 8,956,905, which claims priority to U.S. provisional application No. 61/759,983, filed Feb. 1, 2013, the contents of which are hereby incorporated herein selectively.

U.S. PATENT DOCUMENTS

| U.S. Pat. No. 4,902,648 | February 1990 | Ohta et al |
|---|---|---|
| U.S. Pat. No. 5,103,286 | April 1992 | Ohta et al |
| U.S. Pat. No. 5,108,515 | April 1992 | Ohta et al |
| U.S. Pat. No. 5,246,504 | September 1993 | Ohta et al |
| U.S. Pat. No. 5,318,743 | June 1994 | Tokiai et al |
| U.S. Pat. No. 5,817,188 | October 1998 | Yahatz et al |
| U.S. Pat. No. 6,100,463 | August 2000 | Ladd et al |
| U.S. Pat. No. 6,103,967 | August 2000 | Cauchy et al. |

OTHER PUBLICATIONS

Walton, Principles of thick film materials formulation, The Radio and Electronic Engineer, Vol. 45, No. 3, March 1975, p. 139-143

Min, Thermoelectric Module Design Theories, Rowe, David Michael, ed. Thermoelectrics Handbook: Macro to Nano, CRC press, 2006, Ch. 11

Ohta et al, Characteristics of (Bi,Sb)$_2$ (Te,Se)$_3$ Based Thick-Film Thermoelectric Elements for Power Generation, Electrical Engineering in Japan, Vol. 110, No. 4, 1990, p. 213-219

Markowski et al, Thick-film thermoelectric microgenerators based on nickel-, silver- and PdAg-based compositions, Electronics Technology, 30th International Spring Seminar, IEEE, 2007, p. 223-228

Xi et al, Fabrication of Thermoelectric Modules Using Thermoelectric Pastes and an Additive Technology, Mat. Res. Soc. Symp. Proc. Vol. 545, 1999, p. 143

Navone et al, Development of (Bi,Sb)$_2$(Te,Se)$_3$-Based Thermoelectric, Modules by a Screen-Printing Process, Journal of Electronic Materials, Vol. 39, No. 9, 2010, p. 1755-1759

Navone et al, Optimization and Fabrication of a Thick Printed Thermoelectric Device, Journal of Electronic Materials, Vol. 40, No. 5, 2011, p. 789-793

Lee et al, Thin-Film Thermoelectric Module for Power Generator Applications, Using a Screen-Printing Method, Journal of Electronic Materials, Vol. 40, No. 5, 2011, p. 615-619

Lee et al, Thermoelectric properties of screen-printed ZnSb film, Thin Solid Films, Volume 519, Issue 16, 1 Jun. 2011, p. 5441-5443

Madan et al, Printed Se-Doped MA n-Type Bi2Te3 Thick-Film Thermoelectric Generators, Journal of Electronic Materials S, Vol. 41, No. 6, 2012, p. 1481-1486

Kim et al, Fabrication and Characterization of Thermoelectric Thick Film Prepared from p-Type Bismuth Telluride Nanopowders, Journal of Nanoscience and Nanotechnology, Vol. 12, p. 1577-1580, 2012

We et al, Development of a Measurement Method for the Thermal Conductivity of a Thick Film Prepared by a Screen-Printing Technique, Journal of Electronic Materials, Vol. 41, No. 6, 2012, p. 1170-1176

We et al, Improvement of thermoelectric properties of screen-printed Bi$_2$Te$_3$ thick film by optimization of the annealing process, Journal of Alloys and Compounds, Volume 552, 5 Mar. 2013, p. 107-110

Related to electrode contact to thermoelectric doped bismuth and antimony telluride for thermoelectric devices.

Drabkin, I. A., L. B. Ershova, Electrical Contact Resistance in Thermoelectric Pellets Based on Bi—Sb Chalcogenides, no year, month, or source given on web.

Li et al, Interface Microstructure and Performance of Sb Contacts in Bismuth Telluride-Based Thermoelectric Elements, Journal of Electronic Materials, Vol. 42, No. 6, 2013, p. 1219-1224

Lin et al, Barrier/bonding layers on bismuth telluride (Bi$_2$Te$_3$) for high temperature thermoelectric modules, J Mater Sci: Mater Electron (2011) 22: p. 1313-1320.

Liao et al, Effect of Interfacial Compound Formation on Contact Resistivity of Soldered Junctions Between Bismuth Telluride-Based Thermoelements and Copper, Electrochem. Solid-State Lett. 2007, Volume 10, Issue 9, p. P23-P25

BACKGROUND OF THE INVENTION

1. Field of the Invention

The present invention relates generally to fabrication of solid state electron devices by methods of thick film deposition and subsequent processing, which provides versatility and economic high volume production. The methods are applied to thermoelectric devices to provide advantages towards ultimately lowering the cost per watt for energy harvesting or thermoelectric coolers.

2. Description of the Related Art

Walton discusses the general aspects of thick films and their formulation. For the formulation of thick film pastes, powdered material of metal and/or glass are mixed until homogenous with a vehicle. When the vehicle and solid state powders are combined in the appropriate volume ratios, a thixotropic paste results which can be screen or stencil printed onto substrates. For some specific applications, the vehicle is a polymer with a molecular weight that yields the desired thixotropic properties required for printing when mixed with a powder that is chemically inert with the polymer. In many cases, the vehicle is a polymer, such as poly-methyl methacrylate, ethyl cellulose, or more recently, methyl styrene. Methyl styrene is a polymer that completely burns off without residue at 350° C. This complete volatilization is important in the fabrication of thermoelectric thick films, where purity is of importance for electrical and thermal properties, as is well-known in the field of thermoelectric devices, especially for power generation. Conventional thick film structures for conductors and resistors are generally printed on electrically insulating substrates such as alumina or other ceramic materials, and electrical conduction is parallel to the substrate. In the case of thermoelectric devices, at least in this invention, electrical conducting substrates are used, and conduction is vertical to the substrate. Thus, the two properties of cohesion within the thick film and adhesion to the substrate are important, as cohesion determines the electrical and thermal performance critical to device performance, and adhesion is related to contact resistance, which can directly affect conversion efficiency.

Research in thick film methods have been reported, though there has been no progress in developing a process by which the semiconductor remains pure or is directly bonded to the metal substrate. Ohta et al. [0003] first published work on thermoelectric thick films of the same kind as in this invention, but a glass frit of lead oxide was usually added and the films were not densified by pressure, nor are there any claims in the patents issued to Ohta or Tokiai similar as reported in this invention. Markowski et al. used metal inks, and not the conventional doped semiconductors as are common today.

Xi et al. used an epoxy resin as a binder, while Navone et al. used a 2% by weight polystyrene. In Navone's work, even though a densification process was reported, the polystyrene wasn't volatilized during the heat treatment at 350° C., as this temperature is well below the decomposition temperature. This invention allows heat treatment without cracking and delamination of screen printed films directly onto metal substrates because of the high free volume. In addition, no metal was in contact with the semiconductor during heat treatment in Navone's work.

Lee et al. in two publications used a glass binder for ZnSb and $CoSb_3$ and densified the films by high temperature processing which resulted in porous films. Madan et al. used a 2% by weight epoxy binder with the thermoelectric materials that remained in the thick films. Kim et al. removed the organic binder and used hot pressing for densification of the thick films on alumina substrates in a hydrogen atmosphere, hence the structures were not metallized during this high temperature processing. We et al. printed $Bi_2Te_3$ powders mixed with a glass binder onto oxidized silicon wafers and densified by sintering without applying pressure, resulting in relatively porous films.

No one has reported a direct bond process for fabricating densified thermoelectric semiconductor thick films on metal substrates as provided in this invention. There is a need for such a process in order to lead to high volume manufacturing of thermoelectric device applications at lower cost.

BRIEF SUMMARY OF THE INVENTION

An object of the present invention is to provide a method by which to fabricate thick films in a manner that reduces reactions between the thick film and the substrate on which it is deposited by producing a layer with a high free volume after vehicle volatilization. The layer is heated and during the volatilization process becomes sintered such that it acquires sufficient structural integrity for further processing. The thick film can be densified by pressing to obtain desired material properties such as electrical and thermal conductivity, thereby providing a direct bond process of a thick film to a substrate with sufficient chemical and/or mechanical adhesion and with limited reaction at the thick film-metal interface.

Another object of the present invention is to provide multi-layered thick films with limited interdiffusion at their interfaces and on their substrate through high free volume in an intermediate state prior to densification by pressing, as given above. Such multi-layered thick films can be printed and dried sequentially, heated to volatilize the vehicle, and the remaining solid state constituents in the individual layers are sintered or melted and retain their separateness as layers during the heat treatment, thus forming a direct bond multilayered thick film.

A further object of the present invention is to provide an example of an application in the production of thermoelectric devices, where a primary adhesion layer such as a solder, is first deposited followed by a thermoelectric layer, thus forming a thermoelectric layer with a single electrode.

A still further object of the present invention is to provide a two-electrode thermoelectric device by plating a counter electrode on the semiconductor after a direct bond process, or alternately by combining two single electrode thermoelectric devices under pressure and heat.

The general process is outlined and can be applied for any materials system where there is a fortuitous coincidence of particular material properties, including but not limited to, melting temperatures, vapor pressures, and favorable electrical and thermal properties.

DETAILED DESCRIPTION OF THE INVENTION

The following description presents various inventions, and example embodiments thereof. The various inventions and examples described can be useful alone or in combinations.

Figure 1:
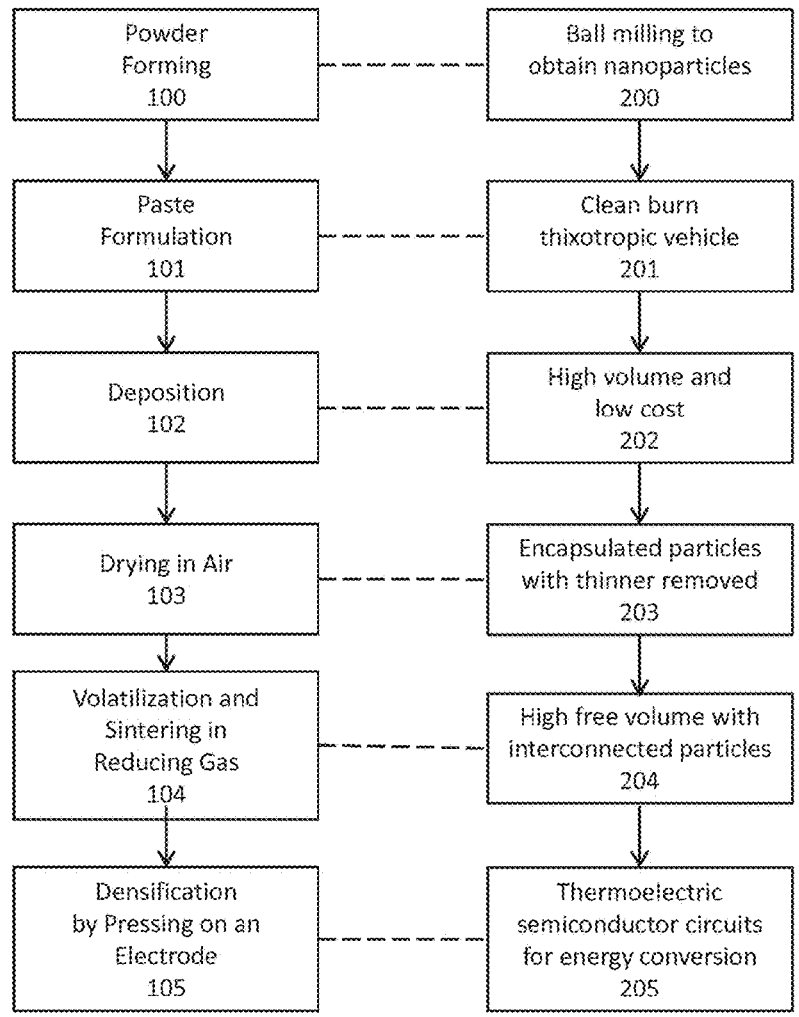
FIG. 1 describes the overall process steps of the invention.

FIG. 1 is an illustration of the discrete process steps relevant to the present invention. Such a process would lead to a progression to discrete thermoelectric devices and modules for energy conversion in high volume production, since thick film technology by screen or stencil printing is well-established. As provided by Min, the thicknesses of discrete p or n type devices for thermoelectric applications can be chosen for maximum power or maximum efficiency. For energy harvesting from heat, the choice is to design in accordance with maximum power, which requires devices that are thinner than those for maximum conversion efficiency. Discrete devices can be fabricated by either a semiconductor 'pellet' [U.S. Pat. No. 5,318,743] or thick film screen printing as given in the several publications cited. Pellets are typically greater than 0.5 mm in thickness, while thick films are typically greater than 0.1 mm and less than 0.5 mm.

Embodiments of the present invention can lower the cost of thermoelectric generators (TEGs), since thick film technology is easily applied to high volume production of TEG modules, leading to a lower cost per watt in energy conversion. Such a cost advantage is especially important for geothermal applications leading to power plants wherever a hot spring can supply sufficient water flow and heat on a continual basis. Other applications include the capture of waste heat in industrial environments for conversion to electrical energy.

These TEGs are can be operated at about 100-200° C. on the hot side and room temperature or below on the cold side, or in a manner that provides about 100° C. temperature difference between the hot and cold sides. The optimized operating temperature can depend on choice of solders, and/or the optimized properties of the p and n type semiconductors, and required power output in accordance with the temperature difference between the hot and cold side.

Thick film deposition methodologies allow an approach with several advantages for prototyping and manufacturing. Thickness and cross-sectional area of the thermoelectric elements can be easily modified in accordance with the design for maximum power output. Composition (stoichiometry) of the thermoelectric semiconductor as well as the bonding materials (solder) are easily modified for optimization.

Device layout (lateral dimensions) for circuits are also easily modified and space-filling device geometry for the thermoelectric elements is limited only by the resolution of the printing apparatus, leading to higher cross-sectional coverage in modules, thereby increasing power output.

These advantages above coupled together offer versatility in device optimization and performance for thermoelectric conversion if a reliable pathway to thick film production is found. This approach would also minimize electronic materials deposition waste, allowing more efficient use of available materials, especially important for more expensive materials like Tellurium and, in general, less materials for recycling. Screen or stencil printing leads to ease of manufacturing, as they are typically high yield processes and are conducive to high-volume manufacturing. In addition, there is no vacuum equipment handling and maintenance, which can be expensive. Fabrication of unit thermocouple pairs can be printed by printing sequentially using electroformed stencils if necessary. Thermoelectric elements can be connected in series on pre-metalized alumina substrates and easily scaled to larger arrays consisting of multiple pairs leading to modules. Another advantage is that wire sawing of bulk semiconductors is not necessary, as it is with many thermoelectric products made from bulk semiconductor crystals. Hence, there this overall fabrication and microelectronic packaging strategy can lower the cost/watt over commercially available TEGs once the process is optimized for device performance.

The following thermoelectric semiconductors were used in this work: N-type semiconductor: N-type Semiconductors typically are composed of Bismuth Telluride ($Bi_2Te_3$) and are often doped with Selenium for performance. The standard composition chosen was $Bi_2 Se_{0.3}Te_{2.7}$. P-type Semiconductor: P-type Semiconductors are typically composed of Antimony Telluride ($Sb_2Te_3$) and are often doped with Bismuth for performance. The standard composition was $Bi_{0.5}Sb_{1.5}Te_3$.

I. Nano-Powder Fabrication:

A mechanical alloying method was established with planetary ball milling for the formulation and fabrication of nanopowders that can be combined with a polymer vehicle to screen or stencil print these nanopowders. These nanopowders are commonly known with standard compositions for p and n type telluride-based semiconductor for thermoelectric generator applications; known as Bismuth Telluride (doped with Selenium) and Antimony Telluride (doped with bismuth). These semiconductors are typically paired in parallel electrically to create a 'p-n thermocouple pair'.

Processing of P and N Type Thermoelectric Nanopowders

Step 1: The individual constituent elements are measured out in the correct proportions and loaded into a milling jar with grinding media. Hardened stainless steel tungsten carbide jars and media were used provided by Retsch or Across International. See FIGS. 1, 100 and 200.

Step 2: The grinding jars are loaded into a planetary ball mill where they are allowed to grind for a set amount of time at a set speed.

Step 3: The thermoelectric material is separated from the grinding media with a sieve and further processed into a thick-film paste. The mesh of the sieve may vary in accordance with the desired particle size, which is dependent on the ball milling process. The ball milling process is chosen to provide a statistical range of desired particle sizes. For screen printing, the sieve must have an aperture size that is somewhat less than the screen aperture to ensure efficient printing, while for stencil printing the mesh number of the sieve is very flexible. A 500 mesh sieve will result in good thick film paste thixotropy when mixed with the proper amount of vehicle, as discussed below.

II. Paste Formulation

General Aspects (FIG. 1, 101, 201).

It is well-known in the technology of thick film paste formulation that solid particles of a preferred size are mixed with a polymer of a preferred molecular weight and a thinner capable of dissolving the polymer. The proper mixing of these constituents ideally results in (1) a printable paste and (2) specific electrical properties after the polymer is volatilized. The size of the particles and the ratio of the solids volume to polymer volume are important in obtaining the proper viscosity and thixotropic properties (Walton). The printed films are typically processed at temperatures which sinter the films, and as such, the films are cohesive (have some internal structural integrity) and adhere to the substrate. The bonding of the sintered solids may be both chemical and/or mechanical in nature.

The polymer used here for thermoelectric pastes is commonly known as methyl styrene (CAS#25014-31-7), and was purchased from Dupont pre-blended with an organic thinner (diethylene glycol butyl ether, CAS#112-73-2). Methyl styrene is known to have a clean burn-off at 350° C. and leaves essentially no noticeable residues after completely volatilization for several minutes (depending on the volume tested) at 350° C. or greater. After several volatilization experiments involving only the thick film polymer vehicles without any solids, the above information was confirmed. A complete volatilization can help avoid inert impurities in the semiconductor thick film legs which affect electrical and thermal conductivity; these impurities could otherwise reduce thermoelectric conversion performance.

A thinning agent is used to adjust the viscosity of the thick film paste in order to screen print or stencil print. This thinning agent must be compatible with the methyl styrene in terms of solubility, such as Diethylene Glycol Dibutyl Ether, in which the polymer is soluble.

Formulation of Thick Film Based Thermoelectric Devices

General Aspects (FIG. 1, 101, 201).

The formulation of thick film thermoelectric paste and its subsequent thermal processing for the fabrication thermoelectric p and n type devices is in accordance with removing the polymer completely to maximize performance. In addition, since the polymer is completely volatilized at the process temperatures, the solids need (1) to be at least partially sintered, which will provide a minimal degree of structural integrity, and (2) have adhesion to the substrate to withstand further processing.

Semiconductor Paste i. A thermoelectric semiconductor paste was formulated with methyl styrene-based vehicle at about 45-65% by volume, with a preferred volume percentage of 55%. At 55% volume, more favorable and predictable thixotropic properties (viscosity and printability) result with particle sizes of 45 micron or below. While larger particle sizes also work, in order to screen print, a particle mesh size of 325 to 500 or higher is preferred because of limitations in the screen mesh sizes. Particle sizes of up to about 200 micron (70 mesh)

were tested. Pastes formed with larger particles are easily printed using a stencil with apertures that are larger than the largest particle size.

ii. The origin for the notion in making the free volume of the microstructure of the sintered components about 55% is indicated, at least in part, by consideration of interconnected spheres. Though the actual microstructure of the sintered components consists essentially of randomly interconnected particles which are not typically spherical, a spherical particle model suffices to provide an example of interconnectedness that can be calculated using geometric formulae. A sphere of unit diameter contained within a cube with edges of the same unit dimension is considered. An array of these spheres, each touching so as to form an interconnecting organized matrix (such as in a cubic crystal lattice) is considered for purposes of modeling an interconnected filamentary network. Each sphere within a cube of unit edge length has a volume that is about 52% of the volume of the cube. If each sphere represents a solid particle, then the free volume (empty space) between the spheres is about 48%.

iii. As it turns out, when making a thixotropic paste from solid particles and a suitable polymer vehicle, the thixotropic properties are very suitable at about the same volume percentage (~50%), thus providing an advantageous method for making a filamentary interconnected network of sintered particles thorough printing and sintering techniques. To further limit interdiffusion at the interface between the printed semiconductor layer and the bonding materials, the free volume can be increased to 55% while making the thixotropic properties even more favorable, as was found through practice in the formulation of pastes.

iv. In general for any solid powder, the weight percent of solids in the paste depends on the overall density of the solids. For $Bi_2Te_3$ paste formulation, for example, a 55% methyl styrene volume is equivalent to about 12.6% by weight methyl styrene. The thixotropy and viscosity of the final paste can be adjustable to a wide range by controlling the volume or weight percent of the thinner.

v. As noted above, the vehicle is completely burned off after volatilization and the polymer volume is typically 55%. Thus, after volatilization, there is a free volume within the remaining solids of 55%. A much lower weight percent of the polymer, such as 2%, does not result in a high free-volume after thermal processing, even if the polymer is volatilized. For the case of $Bi_2Te_3$, the free volume would be about 15%. This aspect of this invention is important and will be mentioned later.

Metal Bonding Paste Formulation i. In order to bond the semiconductors to metal substrates, custom adhesion promoting bonding materials, also in a printable paste form, were made by mixing powder of suitable particle size, vehicle, and a thinner, as with the semiconductors. The bonding material in powder form can consist of a single element, mixtures of elements and/or, alloys (pre-alloyed binary, ternary, or quaternary solder alloys). The printable paste is formulated with the same vehicle, methyl styrene, for a clean burn-off. The bonding material is chosen to be compatible by design in composition and melting temperature with a specific substrate and compound semiconductor element, and have also been formulated similarly to the method of making thermoelectric semiconductor pastes. These formulations have been tested with the n and p type semiconductors and nickel substrates and are referred to as solder pads.

ii. The thermal processing of the solder pads may be prior or concurrent to the volatilization (sintering) of the semiconductor pastes. When methyl styrene is used to formulate the solder pad pastes, and the methyl styrene in the solder pads are volatilized at 350° C., the free volume of the solder print post-sintering appears to depend on the melting temperature and surface tension of the liquidus phase of the elements or alloy at the sintering temperature (minimum 350° C.). In some cases it was observed that the solder pads have a much lower free volume, indicating consolidation through complete melting during volatilization.

iii. It is preferred that the bonding materials reach a liquidus at some point in the thermal processing, as this will likely increase the chemical bonding to the metal substrate, possibly through interdiffusion or wettability to the metal substrate.

The solder pads can also be fabricated in the typical method using screen printable commercially available solder pastes, resulting in zero free volume. This method, however, results in more interfacial reaction at the interface between the solder material and the semiconductor. In order to fabricate efficient thermoelectric devices, the interfacial reaction between the semiconductor and solder pad in generally minimized since it affects contact resistance. This interfacial reaction can be kept to a minimum through this invention. This aspect will be discussed later.

III. Processing of Thick Film Based Thermoelectric Devices

Figure 3:
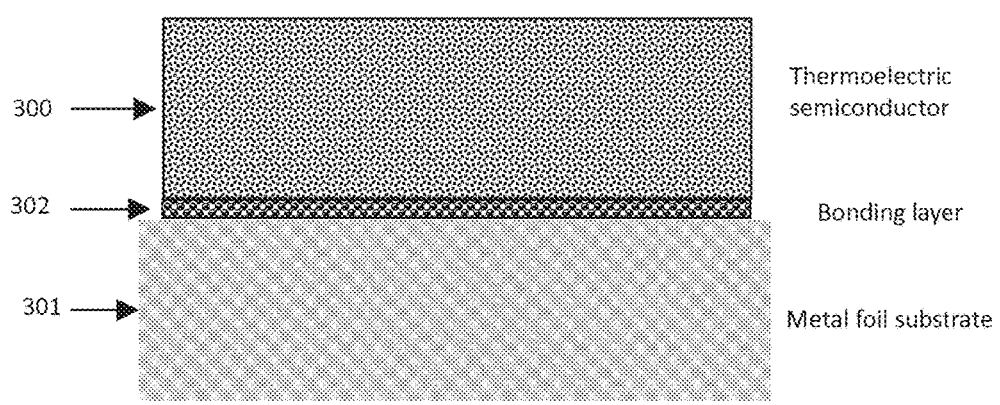
FIG. 3 illustrates a multi-layered thick film on a single electrode, where the layer next to the metal foil, is a bonding layer such as a solder alloy.
Figure 4:
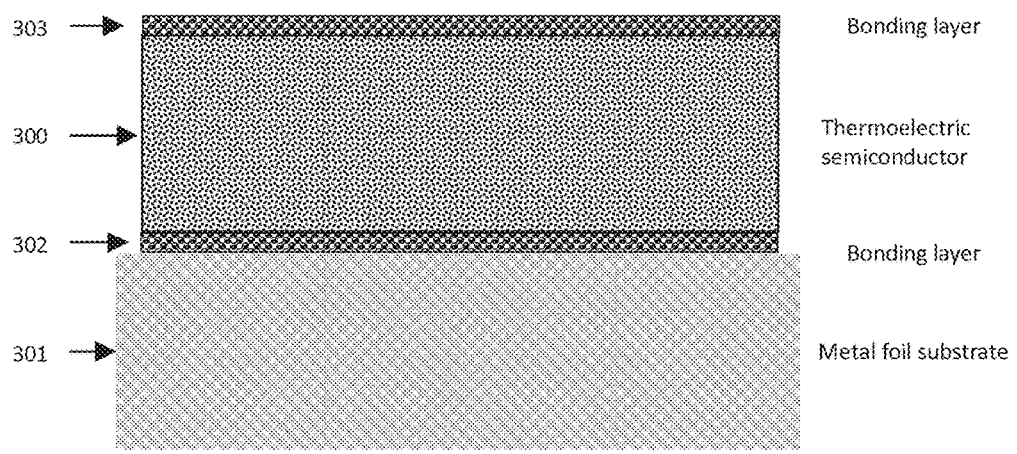
FIG. 4 illustrates a multi-layered thick film, where there is a third thick film to provide another bonding layer, such as a solder alloy.
Figure 5:
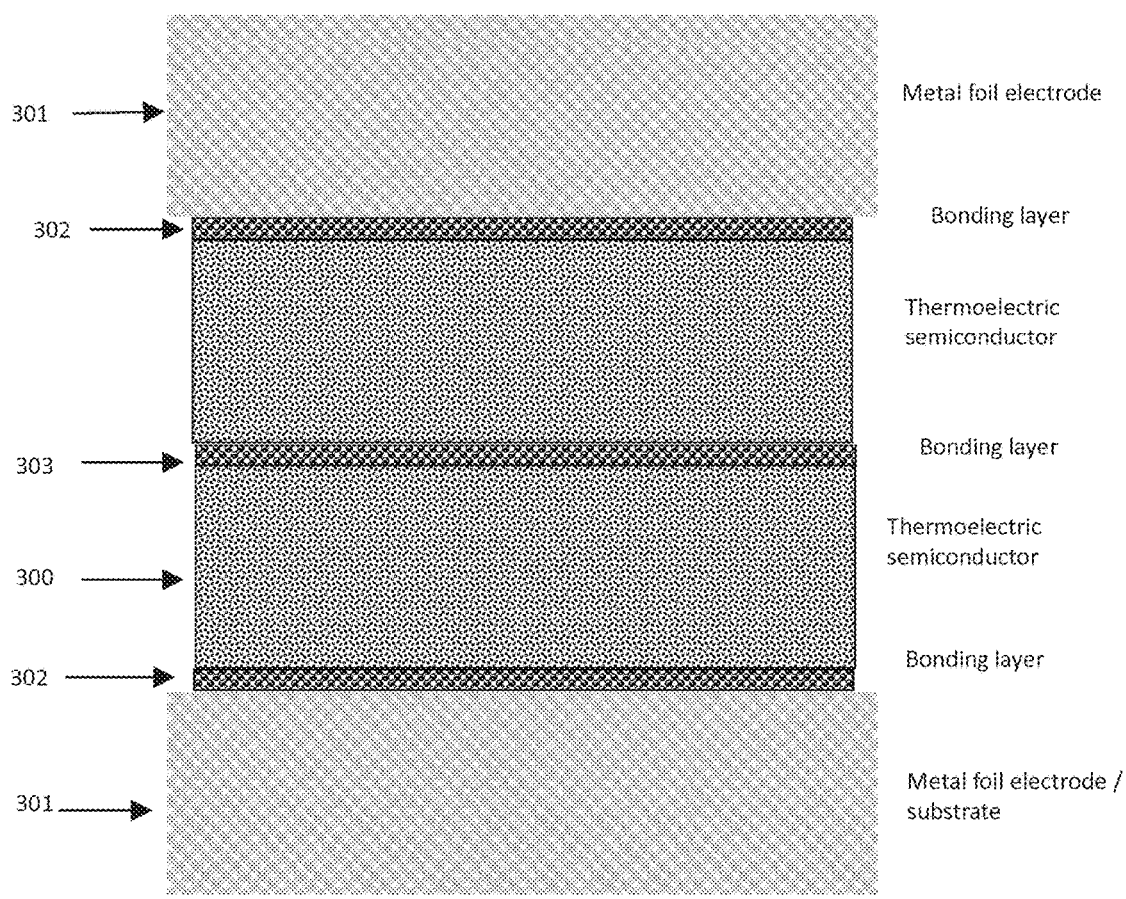
FIG. 5 illustrates a device with an electrode on the top and bottom of the stack to form an electron device.

Printing/Drying (FIG. 1, 102, 103, 202, 203; FIG. 3, 300, 302).

i. A 0.5 mil or greater emulsion thickness for a screen, or alternately as much as a 10 mil thick stencil, patterned with arrays of rectangular apertures of varying size, thick films were printed onto substrates to form thermoelectric pads as test structures. Thick films of semiconductor pads ranging from approximately 0.5 and 10 mil thickness, in accordance with the thickness of the emulsion or stencil, were printed with excellent resolution to form test patterns. Such test patterns on various substrates were used to determine compatibility of the various metal substrates with the semiconductors and optimize the thermal processing. This was accomplished by measuring the Seebeck coefficient (open circuit voltage) at 100° C. temperature difference as a means of gauging the success given the materials and thermal processing scheme. In this manner, feasibility could be readily determined for various combinations of test structures without forming a counter electrode on the semiconductor.

ii. At this point, the films may be printed over again by registration to the existing pattern to increase the thickness of the semiconducting elements prior to sintering or add a top bonding pad for contact to a top electrode [303]. Multiple prints can also be performed before drying. Alternately, and preferred, adhesion-promoting materials such as a custom solder alloy [302, 303] as discussed above (detailed later) can be printed prior to printing the semiconductor pads. The n type and p-type semiconductors were used without such a layer in these experiments and had robust adhesion to nickel after pressing. Additionally, there is a well-known reaction between nickel and tellurium which is detrimental to contact resistance, thus it is preferred that an intermediate layer, or solder layer, be printed prior to the semiconductor, hence this is the preferred method. This interlayer material between the metal substrate [(301)] and the semiconductor [300] (source of thermoelectric effect) is easily tuned in terms of composition by material design to have the proper melting temperature that is equal to or less than the sintering temperature. The sintering temperature is dictated by the volatilization temperature of the methyl styrene, which is a minimum of 350° C.

iii. Arrays of solder and semiconductor pads were printed and dried sequentially with registration of the semiconductor pad to be centered within the printed solder pad. The substrate in most cases was nickel with dimensions typically 36 mm×36 mm×5 mil and 27 mm×34 mm×5 mil. The 5 mil thickness was found to be the most suitable in terms of substrate strength and subsequent processing. The substrate thickness was in the range of 1 mil to 10 mil. After printing, the thick films were dried at about 100-150° C. to volatilize the thinner, at which point there is only the bonding pad powder material (solder-like) or semiconductor powder encapsulated by the polymer. This 'green' state protects the powders from oxidizing in atmosphere.

iv. Test patterns of thick films of approximately 0.5 and 10 mil for the solder and semiconductor pads, respectively, in accordance with the thickness of the screen emulsion or stencil, were printed with excellent resolution and overlay.

v. In order to gauge the value Seebeck voltages of experimental test structures, a baseline Seebeck voltage is determined for a given semiconductor powder. A sample of the pure semiconductor powder used in making the paste is pressed at several tons, forming a thin pellet with about the same area that is printed with the paste. The Seebeck voltage for this powder is measured at 100° C. temperature difference. The Seebeck coefficient is used as a means by which evaluate the success of the materials and processing.

vi. Alternately, the above films may be sintered, pressed, and additional films, not necessarily of the same material (solder alloys), can be printed over the pads by registration to the pattern of pads.

vii. Any conceivable variation of the above materials printing, drying, pressing, reprinting may be permissible in terms of fabricating a thermoelectric device structure as discussed later. See FIGS. 2-5.

Figure 2:
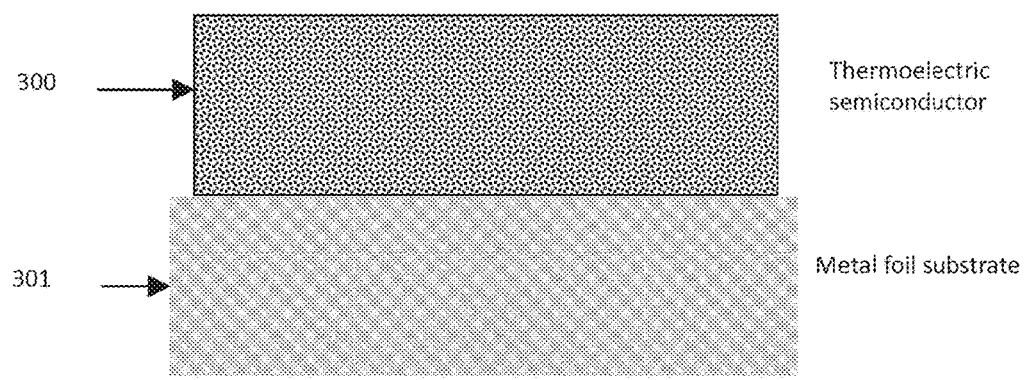
FIG. 2 illustrates a cross section of a single layered thick film directly bonded to a metal substrate, a single electrode.

Sintering (FIG. 1, 104, 204):

This process includes volatilization of the methyl styrene polymer and sintering of the semiconductor simultaneously.

i. The volatilization involved 350° C. for at least 26 minutes, given the nature of the furnace, with the prints fully exposed to a gas ambient comprised of about 5% hydrogen in argon with at least 3 liters per minute flow rate in a 6 inch diameter quartz furnace tube. By exposing the printed structures (square pads), the methyl styrene is volatilized in the least amount of time. Without a direct open exposure to the gaseous ambient, the volatilization can require longer times. It is important to minimize the time at the peak temperature after volatilization of the polymer, since this will allow more time for interfacial diffusion between materials even with considerable free volume in the thick film layers.

ii. The pattern definition of the films is retained, as the process temperature is well below the melting point of both types of the semiconductors, and the microstructure of the pads consists of a sintered powder. The sintered powder has sufficiently interconnected grains, or filaments, such that the printed pads have enough structural integrity to support itself. It appears that the sintered powder is structurally composed of a filamentary interconnected network that is sufficiently strong enough to retain its shape for further processing, which includes consolidation by pressing. That is, the printed pads have sufficient adhesion to the substrate, or solder pad, and cohesion within itself to remain intact regardless of substrate orientation. That is, for the proper choice of materials, the sintered films with the printed pads may be turned upside down with the pads remaining in place.

iii. The choice of methyl styrene and its clean burn-off allow for the fabrication a printed materials which have essentially the same purity as the original material only with relatively high free volume (average density is very low). We chose to call this microstructure a filamentary interconnected network, or FIN. The sintered microstructure of the semiconductor has a free volume estimated to be over 50% as mentioned earlier. For the solder layer, it is estimated to be the same or somewhat less, depending upon the degree of melting and agglomeration during thermal processing, in which case there can be consolidation and the free volume, if any, is considerably reduced. The fact that the semiconductor materials sinter, forming a cohesive microstructure, and the fact that the some semiconductor materials can be bonded to the substrate through their own adhesion, or preferentially the adhesion is assisted by first printing adhesive materials, such as solders, allow for unique thermoelectric semiconductor pads on metal foil or metallized substrates, such as copper clad alumina or anodized aluminum.

iv. Because the free volume is significant, the effective coefficient of thermal expansion of the thick films during sintering essentially matches that of the substrate, since the FIN can accommodate by expanding or contracting and still remain intact.

v. The powder, during the thermal processing, forms an interconnected microstructure with sufficient cohesiveness. The cohesive strength allows the sintered thick films to be further processed conveniently, which is consolidation through pressing, without a binding agent such as glass. Glasses (frits) are commonly used in thick film formulation to provide a sintering agent which binds metal particles together, for example. These binding agents are generally non-conductive and increase the resistivity of the processed thick film, while at the same sufficiently melting or softening enough to provide consolidation after the polymer vehicle is volatilized. The nanoparticles powders of the semiconductors are mechanically alloyed by ball-milling.

vi. The thermal process is essentially a non-densification sintering process which involves at atomic diffusion in order to join at least of the particles together to form an interconnected microstructure. Some partial melting could occur, especially for the smaller particles, due to structural melting point depression as described by the Gibbs-Thomson effect. In this case, the melting point of the semiconductors is reduced as the particle size is reduced. In addition to this effect, smaller particles are expected to have a higher vapor pressure at the thermal process temperature; hence atomic movement is also enhanced for nanoparticles of the semiconductor.

vii. It has been experimentally observed that a discoloration surrounding the thick film semiconductor pads, which is form the elements with higher vapor pressures during thermal processing. The discoloration is the reaction with the nickel substrate. Since antimony and tellurium have the highest vapor pressures, the discoloration of p-type thick films usually is more noticeable.

viii. Considered also is the melting temperatures of bismuth and antimony telluride, which are 585° C. and 620° C., respectively, with respect to thermal processing. Since the thermal process temperature must be at least 350° C. to volatilize the methyl styrene, the process temperature is close to 80% of the melting temperatures. At temperatures close to the melting point, there is considerable kinetics, which also assist in the evolution of the microstructure to form an interconnected network.

ix. Thus, there appears to be fortuitous coincidence of certain material properties and thermal processing schedules that is an advantage in the fabrication of thermoelectric semiconductor thick films. The properties directly related to the fabrication involve the coefficient of thermal expansion, vapor pressures of various semiconductor elements, chemical reactivity at interfaces, and free volume which limits the interfacial reactions. A high temperature process window with a relatively short process time allows fabricating unique thick film thermoelectric semiconductor compounds with competitive Seebeck voltage output through screen or stencil printing, thus allowing low-cost manufacturing.

x. Methyl styrene volatilizes at 350° C. with limited compositional changes in semiconductors and leaving pure thermoelectric semiconductor after sintering. Tellurium and selenium have relatively high vapor pressures, thus it can be important to minimize process time at higher temperature to avoid compositional changes to avoid changing the thermoelectric performance of the semiconductors. Though the starting compositions can be modified to compensate for compositional changes due to the presence of elements with relatively high vapor pressures at the sintering temperature, it can be beneficial to avoid having the elements condense on portions of the furnace, which would then increase material lost in processing.

xi. Thus, it is fortuitous that methyl styrene is (1) completely volatilized within 26 minutes using the equipment above, hence keeping compositional changes from escaping high vapor pressure elements in the semiconductor manageable, and (2) the minimizing the interfacial reaction between the semiconductor and any materials in direct contact due to the high free volume of the thick film semiconductor. The volume density of the semiconductor at the semiconductor-metal interface is 45% (typically), the same amount as the fraction of solids in the paste formulation. The bulk density of $Bi_2Te_3$ is about 7.7 g/cm$^3$, giving the effective density of the thick film as ~3.5 g/cm3 at the interface which limits interfacial reaction considerably.

xii. Sintering of the thermoelectric semiconductor materials can help to make the printed nanopowders cohesive, adhesive to the metal foil substrate, and optimized for performance. Contact resistance between the semiconductors and the underlying material (metal foil substrate or solder pad on metal foil) should be as low as possible for high performance of the TEG devices, especially thin thermoelectric semiconductor devices. Pure semiconductor powder can be sintered and pressed, as mentioned previously, to make a test pellet for measuring the Seebeck voltage. Thus far, it has been experimentally established in this work that p type semiconductor pellets show an increased Seebeck voltages as the sintering temperature is increased from 350° C. to 400° C., while n type semiconductor pellets show a decreased Seebeck voltages as the sintering temperature is increased to 400° C. from about 300° C. Thus, a minimum sintering temperature for volatilization of the methyl styrene falls slightly above the optimized sintering temperatures for n type material (~300° C.) and slightly below the optimized sintering temperature for p type materials (400° C.). Additional experimentation can be used to optimize the thick film process temperatures and overall fabrication methodology, similar to the manner in which the sintering temperatures for pellet samples are optimized.

xiii. The high free volume microstructure of sintered semiconductor materials (and in some cases solder alloy pads) has the benefit of limiting intermediate reaction products formed by interdiffusion at interfaces between the solder alloy pad structures or the metal electrode (no solder pad). Though the chemical nature of intermediates can be estimated through phase diagram analysis, they introduce another unknown in terms of their electrical and thermal properties. Although it is desired to limit the formation and thickness of intermediates, a minimum thickness is required to promote chemical adhesion through their formation. Thus, the minimum thickness of the intermediate layer is determined by the requirement of sufficient adhesion between the two contacting layers. An additional sintering step to induce interdiffusion bonding may be required after pressing to ensure adequate bonding of the layers, since the interaction of adjacent materials is limited by virtue of high free volume during initial sintering.

xiv. Fabrication of single-electrode device structures: The cross-section of a single-electrode thick film is illustrated in FIG. 2, 300, 301.

The microstructure is at the state of high free volume and ready to be densified. It is shown standing vertically to illustrate the structural integrity of the thick film.

Process Overview Summary i. Each layer is screen or stencil printed with appropriate custom paste. Substrates were typically 5 mil thick nickel with substrate lateral dimensions typically ranging from 2.7-3.6 cm in the form of squares or rectangles. Nickel [301] was chosen for its temperature coefficient of linear expansion, availability as a foil, and oxidation resistance. Each layer had a dedicated screen or stencil in order to deposit a specific thickness with a pattern of square test structures of varying edge dimensions. Each screen or stencil formed a set and were registered for alignment to one another and used in sequence to form the final device. The solder pads [302, 303] were slightly larger than the semiconductor test squares [301] and the semiconductor test structures were printed such that they were centered over the solder pad square to avoid direct contact with the substrate. The square test patterns for the semiconductor had edges ranging from 1 to 5 mm, giving 1 to 25 mm$^2$ per test structure. A preliminary polyimide layer (not shown) was optionally deposited around each test structure for isolating single test structures. This layer provided an electrical insulating layer for combining single electrode devices without shorting the electrodes, as there was a tendency for the soft nickel substrates to curl at the edges when cut by a scissor. For combining two single electrode device halves, an optional final layer of a selected solder was deposited over the semiconductor prior to sintering.

ii. Sintering [104] I Pressing processes [105]: Sintering: the high volume percent of the polymer in the pastes, which is completely volatilized by sintering at 350° C. for about 30 minutes, allows for a high free volume in the remaining printed structures after volatilization. This high free volume introduces distinct advantages as described above through its microstructure for unique fabrication of layered materials and interfaces in general, with thermoelectric devices being a distinct application. The advantages can be summarized as follows:

Each layer can be pressed [105] at several tons of pressure after it is sintered, or the multiple sequential layers can be printed and dried as a process step for each layer, and then sintered and pressed at several tons to complete a single-electrode device. Applied pressures here ranged from 1 to 40 tons depending on total printed semiconductor area. Total semiconductor area typically was about 5 cm$^2$ of semiconductor area per substrate. To obtain layers with near normal bulk density of the compounds and alloys, about 20 MPa pressure was applied. (N and P type devices can be optimized separately in terms of fabrication processing).

iii. Because of high free volume of non-pressed layered structures from printing and sintering together, the amount of volume interaction between two FIN microstructure layers is very limited, thus dramatically limiting possibly undesired intermediate compound formation between two different layers normally formed by interdiffusion bonding between two layers. This is especially true if neither material is pressed prior to further sintering.

iv. These FIN microstructures can be permeated with another material that is in liquid form and has a low surface tension for modifying the layer. For example, gallium-indium alloy which has a melting point of about 30° C. and is known to make good contact with these thermoelectric materials.

v. Printing, sintering, and pressing process may be done in any manner which facilitates the fabrication of a thermoelectric device, which includes using different materials to make 'stacked' thermoelectric devices as mentioned in the literature, as long as the materials are sequentially compatible. However, it is understood that pressing might only follow the volatilization of the methyl styrene following printing in a given sequence of steps to make a new layer.

Bonding single-electrode. Each discrete device is bonded to the other by use of a solder, or the surfaces of the semiconductors can be thermo-compression bonded at elevated temperatures and pressures. See FIG. 3.

Experimental samples: See FIG. 4. Screen-printed n type single-electrode on 36×36 mm nickel foil substrate 5 mils in thickness. Thermoelectric thicknesses are approximately 100 microns.

Seebeck voltages were about 16 mV or greater at 100° C. temperature difference. The process for making the thermoelectric thick films was very repeatable and not optimized.

Notes on Solder Alloys i. Solder alloys can be custom formulated to have a liquidus state at a given process temperature by combining a low melting temperature metals with high melting temperature element, such as silver or antimony, since wetting behavior will facilitate interdiffusion bonding between the solder and the semiconductor and minimize voids at the interface. To achieve this wetting behavior, a balance between the surface tension of the liquidus, the percent of liquidus at the process temperature, and the volume density of the solder alloy in the solder pastes will allow for a large variation of microstructural growth of the solder layers.

ii. The solder alloy can be designed to form a liquidus phase that melts just below the process sintering temperature by the addition of a metal element(s), such as silver, that has a higher melting point than the binary solder. Silver and copper, which also have a high thermal and electrical conductivity, will increase the melting temperature of solder alloys such as Pb—Sn, Bi—Sn, SbSn, Bi—Sb, etc., leading to ternary or quaternary solder alloys. Silver is preferred, as it is less reactive than copper by way of experimental observations at this laboratory. The additional element or alloy is preferably an element with good electrical and thermal conductivity to accommodate high levels of energy conversion efficiency.

iii. Specific examples tried experimentally, not limited to the following, were the addition of silver to $Sb_5Sn_{95}$, Bi—Sn, alloys, and Bi—Sb alloys using a methyl styrene vehicle. Lower melting point binary solder alloys will tend to have normal densities after sintering due to agglomeration, and some bonding pads can have a larger degree of surface roughness, which can be advantageous for mechanical adhesion when printing the semiconductors pads.

The above descriptions of embodiments of the invention are intended to illustrate the invention and not to limit the claimed scope of the invention.

What is claimed is:

1. A process for producing a thick film precursor composition with a free volume microstructure, the process comprising the steps of:
   (a) forming a powder comprising of one or more elements, alloys, or compounds;
   (b) combining the powder with a vehicle and a thinning agent to form a paste;
   (c) depositing the paste to form a layer on a surface;
   (d) drying the layer to remove the thinning agent; and
   (e) at least partially sintering the layer, wherein most of the vehicle is volatized leaving the free volume within the layer, and
wherein the powder becomes an interconnected microstructure with the free-volume within the layer.

2. The process of claim 1, further comprising producing a thick film by (f) pressing the sintered layer.

3. The process of claim 1, further comprising repeating steps (a)-(d) one or more times to obtain a thick film with two or more layers, then performing step (e).

4. The process of claim 3, further comprising producing a thick film by (f) pressing the two or more layers to reduce the free volume.

5. The process of claim 4, further comprising repeating steps (a)-(f) one or more times.

6. A process for producing a layered thick film precursor composition with a free-volume microstructure, the process comprising the steps of:
   (a) forming a powder comprised of one or more elements, alloys, or compounds;
   (b) combining the powder with a vehicle and a thinning agent to form a paste;
   (c) depositing the paste to form a layer on a surface; and
   (d) drying the layer to remove the thinning agent;
   (e) repeating steps (a)-(d) one or more times to obtain a film with two or more layers; and
   (f) at least partially sintering the two or more layers, wherein most of the vehicle is volatized leaving the free volume within the layers, and
wherein the powder becomes an interconnected microstructure with the free-volume within the layered thick film precursor composition.

7. The process of claim 6, further comprising producing a layered thick film by (g) pressing the sintered layers.

8. The process of claim 1 or 6, wherein the step of sintering is effected in a non-oxidizing gas flow.

9. The process of claim 1 or 6, wherein the thick film is directly bonded to an electrode on a substrate.

10. A thermoelectric device comprising an electrode on a substrate, the electrode further comprising a first layer and a second layer, wherein the first layer is a thick film interface and the second layer is a thick film semiconductor, and wherein the first layer is the electrical contact between the electrode and the second layer, and wherein the thick film comprises an interconnected microstructure with the free-volume within the layer, wherein the layer is pressed prior to use.

11. A thermoelectric device comprising an electrode on a substrate, the electrode further comprising a first layer, a second layer, a third layer, and solder, wherein the first layer is the electrical contact between the second layer and the electrode, wherein the second layer is a thick film thermoelectric material, and wherein the third layer is a thick film electrical contact to solder, and wherein the thick film comprises an interconnected microstructure with the free-volume within the layers, wherein the layers are pressed prior to use.

12. The electrode of claim 10 or claim 11, wherein the layers are made of the same material or different material.

13. The electrode of claim 11, wherein the first layer is an electroplated surface on the electrode.

14. The electrode of claim 11, wherein the first layer is deposited by an electroless process on the electrode.

15. The device of claim 10, 11, or 14, wherein the substrate is a thin metal foil, a flexible nickel foil, or a nickel electrode.

16. The process for producing the precursor thick film composition of claim 1 or 6, wherein the powder comprises doped $Bi_2Te_3$ or doped $Sb_2Te_3$.

17. The thermoelectric device of claims 10 or 11, wherein the first layer comprises doped $Bi_2Te_3$ or $Sb_2Te_3$ directly bonded to a nickel electrode.

18. The process of claim 1 or 6, wherein the temperature during the sintering step is about 350° C. or greater than 350° C.

19. The process of claim 1 or 6, wherein the vehicle is selected from the group consisting of methyl styrene, polymethyl methacrylate, and ethyl cellulose.

20. The process of claim 1 or 6, wherein the temperature during the sintering step is equal to or greater than the volatilization temperature of the vehicle.

21. The process of claim 1 or 6, wherein the layer or layers are sintered on a substrate but do not adhere to the substrate.

22. The thermoelectric device of claim 10, 11, or 14, wherein the substrate is anodized aluminum or aluminum coated with an insulator, and whereby metal pads are printed for the fabrication of thermoelectric circuits.

23. The thermoelectric device of claim 10, 11, or 14, wherein the substrate is a metal, and whereby the metal is coated on at least the semiconductor side of the substrate using a loaded polymer, such as polyimide, or a loaded low melting temperature frit.

24. The thermoelectric device of claim 10, 11, or 14 wherein there is an intermediate layer between the thermoelectric material and the electrode or a solder layer, wherein the intermediate layer is doped with halogen or a halogen source.

25. The process of claim 2, wherein the powder comprises two different materials having at least one of different melting temperatures, different particle sizes, or different sintering temperatures.

26. The process of claim 25, wherein the thick film has substantially reduced interdiffusion with an electrode.

27. The process of claim 1 or 6, wherein the free-volume is about 55%.

28. The process of claim 1 or 6, wherein the free-volume is about 45% to about 55%.

29. The process of claim 1 or 6, wherein the free-volume is about 45%.

* * * * *